US009059188B1

(12) United States Patent
Dimitrakopoulos et al.

(10) Patent No.: US 9,059,188 B1
(45) Date of Patent: Jun. 16, 2015

(54) GRAPHENE RESISTOR BASED TAMPER RESISTANT IDENTIFIER WITH CONTACTLESS READING

(71) Applicant: INTERNATIONAL BUSINESS MACHINES CORPORATION, Armonk, NY (US)

(72) Inventors: Christos Dimitrakopoulos, Baldwin Place, NY (US); Dirk Pfeiffer, Croton on Hudson, NY (US); Jean-Olivier Plouchart, New York, NY (US); Joshua T. Smith, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/266,995

(22) Filed: May 1, 2014

(51) Int. Cl.
*H01L 23/28* (2006.01)
*H01L 23/00* (2006.01)

(52) U.S. Cl.
CPC .............. *H01L 23/573* (2013.01); *H01L 23/28* (2013.01)

(58) Field of Classification Search
None
See application file for complete search history.

(56) References Cited

U.S. PATENT DOCUMENTS

| 4,323,772 | A | 4/1982 | Serge |
| 4,850,009 | A | 7/1989 | Zook et al. |
| 5,629,093 | A | 5/1997 | Bischof et al. |
| 7,098,794 | B2 | 8/2006 | Lindsay et al. |
| 7,464,868 | B2 | 12/2008 | Brown et al. |
| 7,940,340 | B2 | 5/2011 | Ludwig et al. |
| 7,998,546 | B2 | 8/2011 | Wisnudel et al. |
| 8,387,876 | B2 | 3/2013 | Wisnudel et al. |
| 2003/0061488 | A1* | 3/2003 | Huebler et al. ............... 713/176 |
| 2004/0028225 | A1 | 2/2004 | Weber |
| 2005/0194454 | A1 | 9/2005 | Ferber et al. |
| 2008/0259416 | A1 | 10/2008 | Peters et al. |
| 2010/0245112 | A1 | 9/2010 | Ludwig et al. |
| 2011/0059599 | A1* | 3/2011 | Ward et al. .................... 438/507 |
| 2014/0162464 | A1* | 6/2014 | Dimitrakopoulos et al. . 438/761 |

FOREIGN PATENT DOCUMENTS

| EP | 0323108 A3 | 5/1989 |
| EP | 1073031 B1 | 7/2008 |

OTHER PUBLICATIONS

Helinski, R., et al. "A Physical Unclonable Function Defined Using Powerdistribution System Equivalent Resistance Variations" Proceedings of the 46th Design Automation Conference. Jul. 2009. (26 Pages).

Kang, J., et al. "Efficient Transfer of Large-Area Graphene Films Onto Rigid Substrates by Hot Pressing" Acsnano. vol. 6. No. 6. May 2012. pp. 5360-5365.

(Continued)

*Primary Examiner* — Marc Armand
*Assistant Examiner* — Younes Boulghassoul
(74) *Attorney, Agent, or Firm* — Tutunjian & Bitetto, P.C.; Anne V. Dougherty

(57) ABSTRACT

According to an aspect of the present principles, there is provided a method and an authentication apparatus. The method includes arranging a plurality of graphene resistors in parallel or series. The method further includes forming a unique identification code based on respective temperatures emanating from or respective voltages output from the plurality of graphene resistors when the plurality of graphene resistors are in a powered state.

20 Claims, 14 Drawing Sheets

(56) References Cited

OTHER PUBLICATIONS

Kobayashi, T., et al. "Production of a 100-M-Long High-Quality Graphene Transparent Conductive Film by Rollto-Roll Chemical Vapor Deposition and Transfer Process" Applied Physics Letters, vol. 102. Jan. 2013. (5 Pages).

Meraglia, J. "Using DNA to Safeguard Electrical Components and Protect Against Counterfeiting and Diversion" International Symposium for Testing and Failure Analysis. Nov. 2011. (4 Pages).

* cited by examiner

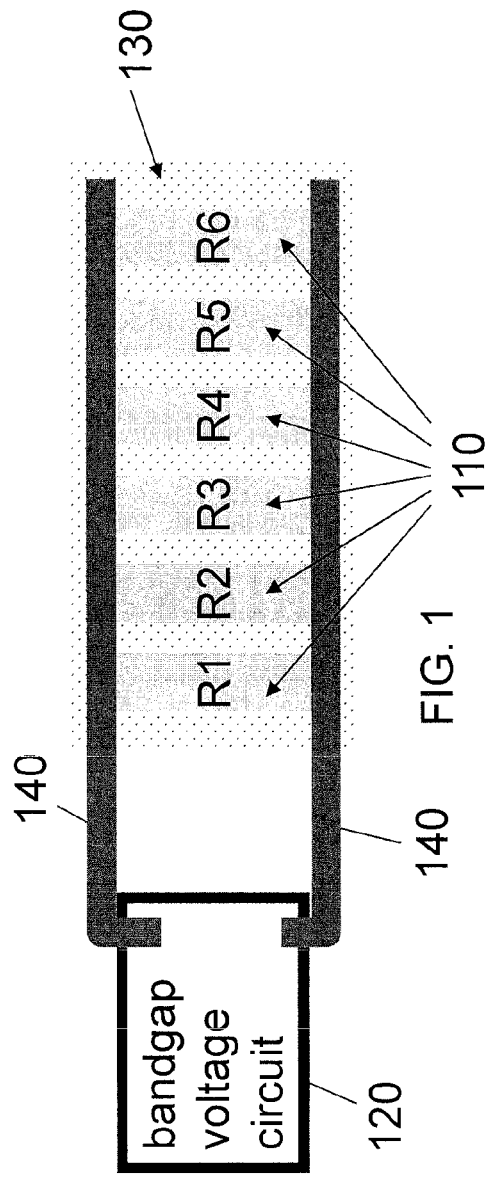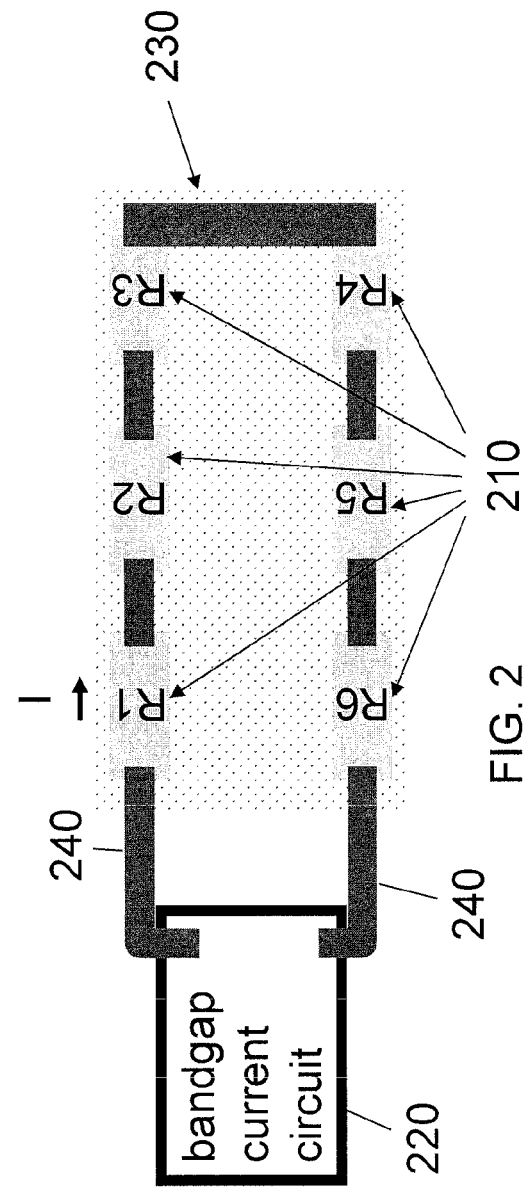

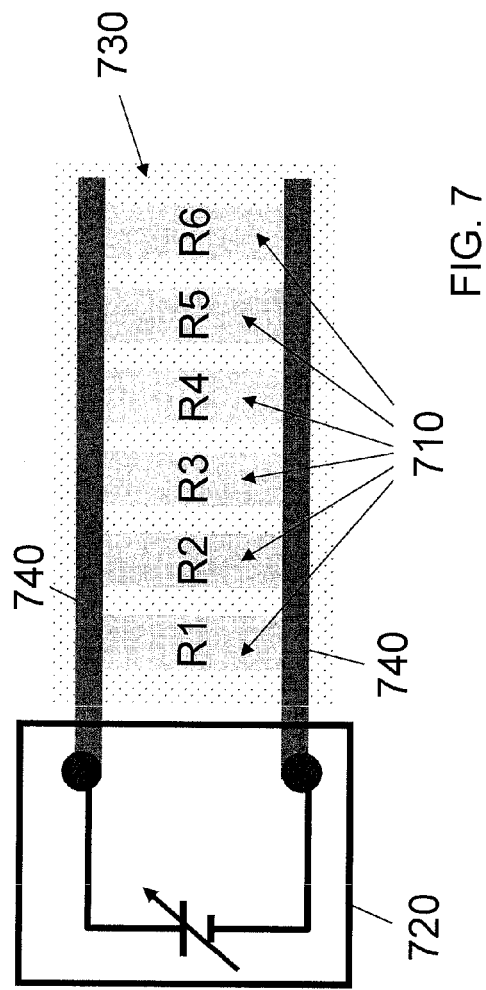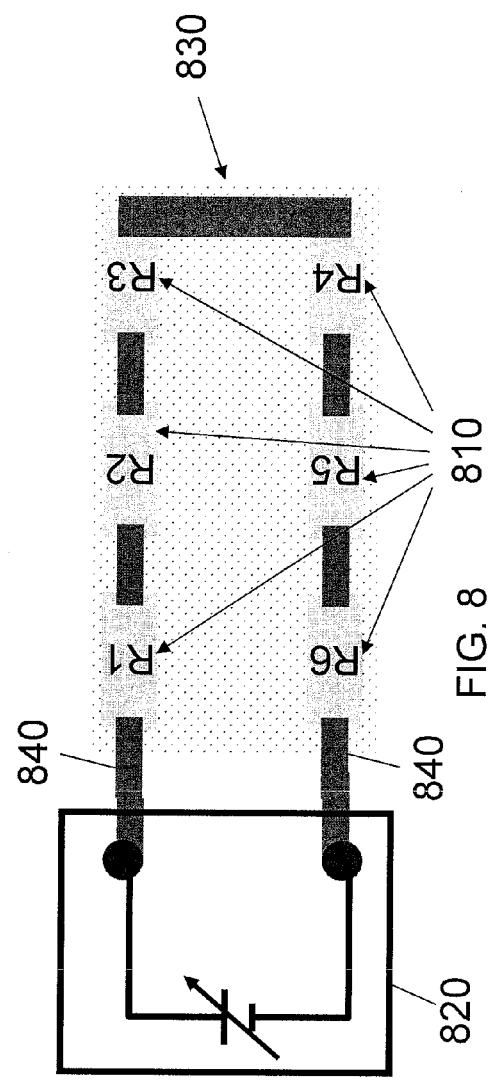

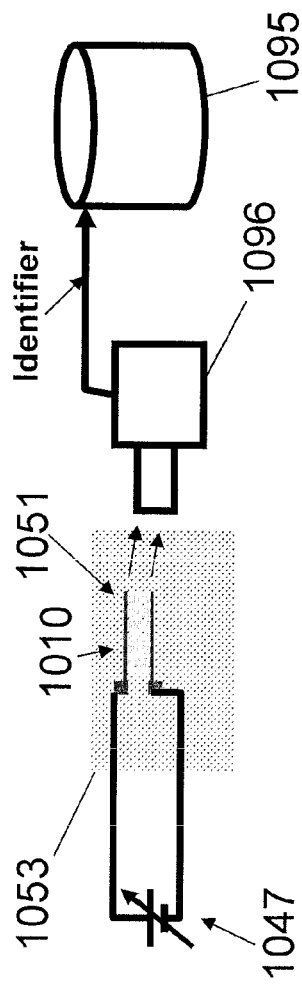
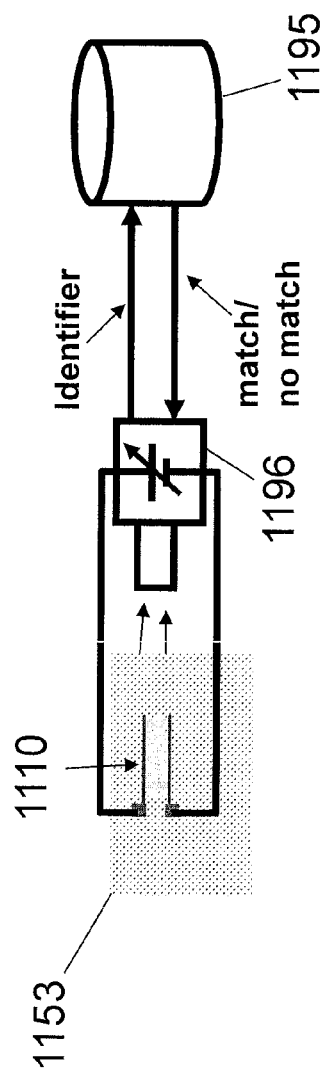
FIG. 10
FIG. 11

GRAPHENE RESISTOR BASED TAMPER RESISTANT IDENTIFIER WITH CONTACTLESS READING

BACKGROUND

1. Technical Field

The present invention relates generally to identification and, in particular, to a tamper resistant identifier with contactless reading.

2. Description of the Related Art

Barcodes are widely used because they are very cheap to fabricate and easy to read. However, barcodes are very easy to copy and therefore, they can be tampered with very easily.

Barcodes can be embedded into a product to prevent the barcodes from being peeled and attached to other products. However, such embedding does not prevent someone from copying the product and its bar code. Thus, the embedding approach cannot prevent copycat products.

Hence, there is a need for a more secure identification system that those based on the use of barcodes.

SUMMARY

According to an aspect of the present principles, there is provided a method. The method includes arranging a plurality of graphene resistors in parallel or series. The method further includes forming a unique identification code based on respective temperatures emanating from or respective voltages output from the plurality of graphene resistors when the plurality of graphene resistors are in a powered state.

According to another aspect of the present principles, there is provided an authentication apparatus. The authentication apparatus includes a plurality of graphene resistors, arranged in parallel or series, forming a unique identification code based on respective temperatures emanating from or respective voltages output from the plurality of graphene resistors when the plurality of graphene resistors are in a powered state. The authentication apparatus further includes a bandgap voltage generation circuit or a bandgap current generation circuit connected to the plurality of graphene resistors for powering up the plurality of graphene resistors in the powered state.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 shows an exemplary graphene resistor parallel configured array 110 forming an on-chip identifier with off-chip reading, in accordance with an embodiment of the present principles;

FIG. 2 shows an exemplary graphene resistor series configured array 210 forming an on-chip identifier with off-chip reading, in accordance with an embodiment of the present principles;

FIG. 7 shows an exemplary graphene resistor parallel configured array 710 that is applied to an object that needs an identifier, in accordance with an embodiment of the present principles;

FIG. 8 shows an exemplary graphene resistor series configured array 810 that is applied to an object that needs an identifier, in accordance with an embodiment of the present principles;

FIG. 10 shows an exemplary configuration 1000 for a manufacturing test, in accordance with an embodiment of the present principles;

FIG. 11 shows an exemplary configuration 1100 for identification in the field, in accordance with an embodiment of the present principles;

DETAILED DESCRIPTION OF PREFERRED EMBODIMENTS

Figure 3:
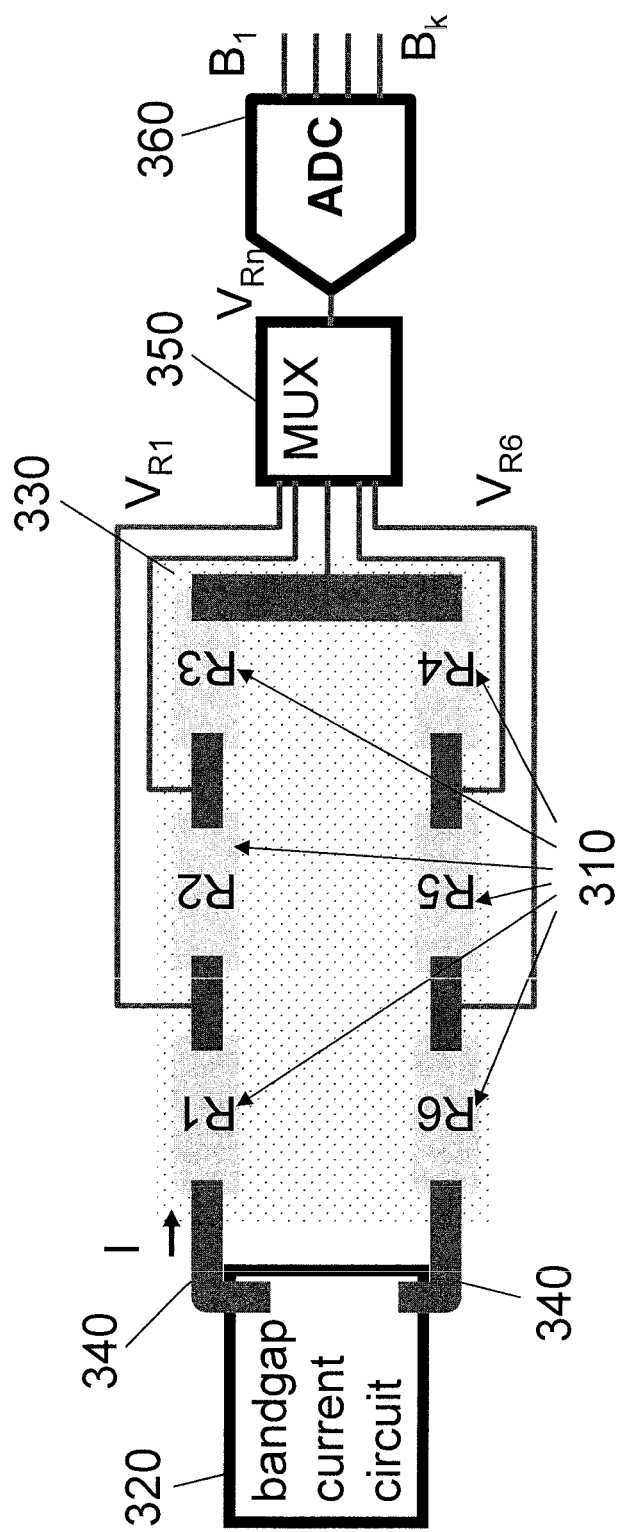
FIG. 3 shows an exemplary graphene resistor series configured array 310 forming an on-chip identifier with on-chip reading, in accordance with an embodiment of the present principles.

The present principles are directed to tamper resistant identifier with contactless reading.

The present principles relate to the fabrication of an identifier that is tamper resistant by using the process randomness of graphene resistor technology to design a physical unclonable function (PUF). The graphene identifier can be either embedded into a chip or into a thin-film technology. The graphene bar code can be made and attached to a product in such a way that it is not possible to remove it without changing its value or code. The present principles also provide several approaches for reading the identifier. At least one such method involves reading the grapheme bar code wirelessly.

FIG. 1 shows an exemplary graphene resistor parallel configured array 110 forming an on-chip identifier with off-chip reading, in accordance with an embodiment of the present principles. In the embodiment, the present principles include an interconnected graphene resistor parallel array 110 embedded into a chip (not explicitly shown), and a bandgap voltage circuit 120 designed into the chip. The array 110 includes resistors R1 through R6. A visualization film 130 including, but not limited to, a thermochromic film, can be used to read the code with a regular camera. While thermochromic film is described herein with respect to one or more embodiments, other materials can also be used including, but not limited to, Leuco dye. Metal connections 140 connect the array 110 to the bandgap voltage circuit 120.

The graphene resistor array 110 generates random resistance-values with large variability during fabrication. The random resistance values allow us to generate a unique identification code, thus implementing a physical unclonable function (PUF). Since graphene has no bandgap, graphene resistor values do not change with temperature. This allows us to guaranty the identifier stability across temperature. The bandgap voltage circuit 120 is used to generate a voltage that is independent of process, supply voltage, and temperature variability. When the chip is powered up, the bandgap voltage circuit 120 generates a fixed DC voltage. Each graphene resistor in the array 110 dissipates a power $V^2/Rn$, and therefore each will have different respective temperature. The temperature profile can be read by a thermal camera. The visualization (e.g., thermochromic) 130 film can be used to transform the thermal information into color, thus allowing the use of a regular camera.

Another important property is that any attempt to remove a graphene sheet would destroy it physically or change the identification code. Indeed any exposure to air would change the graphene resistor values. This makes the graphene resistors tamperproof.

FIG. 2 shows an exemplary graphene resistor series configured array 210 forming an on-chip identifier with off-chip reading, in accordance with an embodiment of the present principles. In the embodiment, the graphene resistors in the array 210 are connected in series. The array 210 includes resistors R1 through R6. A bandgap current circuit 220 is used to generate a current that is independent of process, supply voltage and temperature variability. The current is indicated by the letter "I", with an arrow showing a corresponding direction of flow of the current. When the chip (not explicitly shown) is powered up, the current voltage circuit 220 generates a fixed DC current. Each of the graphene resistors in the array 210 respectively dissipate a power $Rn\ I^2$, and therefore will have different temperatures. The temperature profiles of the resistors R1 through R6 can be read by a thermal camera or regular camera if a thermochromic film 230 is used. Metal connections 240 connect the array 210 to the bandgap current circuit 220.

FIG. 3 shows an exemplary graphene resistor series configured array 310 forming an on-chip identifier with on-chip reading, in accordance with an embodiment of the present principles. The series connected graphene resistors in the array 310 are powered by a bandgap current circuit 320 and a MUX 350 multiplexes all the resistor analog voltages $V_{R1}$ through $V_{R6}$ to output voltage $V_{Rn}$ that, in turn, is provided to the input of the analog-to-digital converter (ADC) 360 integrated into the chip (not explicitly shown). The array 310 includes resistors R1 through R6. Since the bandgap current circuit 320 generates a known current independent of temperature, this allows the chip to read the graphene resistor values within the accuracy of the ADC 360. The output of the ADC 360 can have any of values $B_1$ through $B_k$. The output of the ADC 360 can be made to correspond to a digital word that is proportional to the analog input voltage. The digital word can be converted into a decimal number. The current is indicated by the letter "I", with an arrow showing a corresponding direction of flow of the current. The temperature profiles of the resistors R1 through R6 can be read by a thermal camera or regular camera if a thermochromic film 330 is used. Metal connections 340 connect the array 310 to the bandgap current circuit 320.

Figure 4:
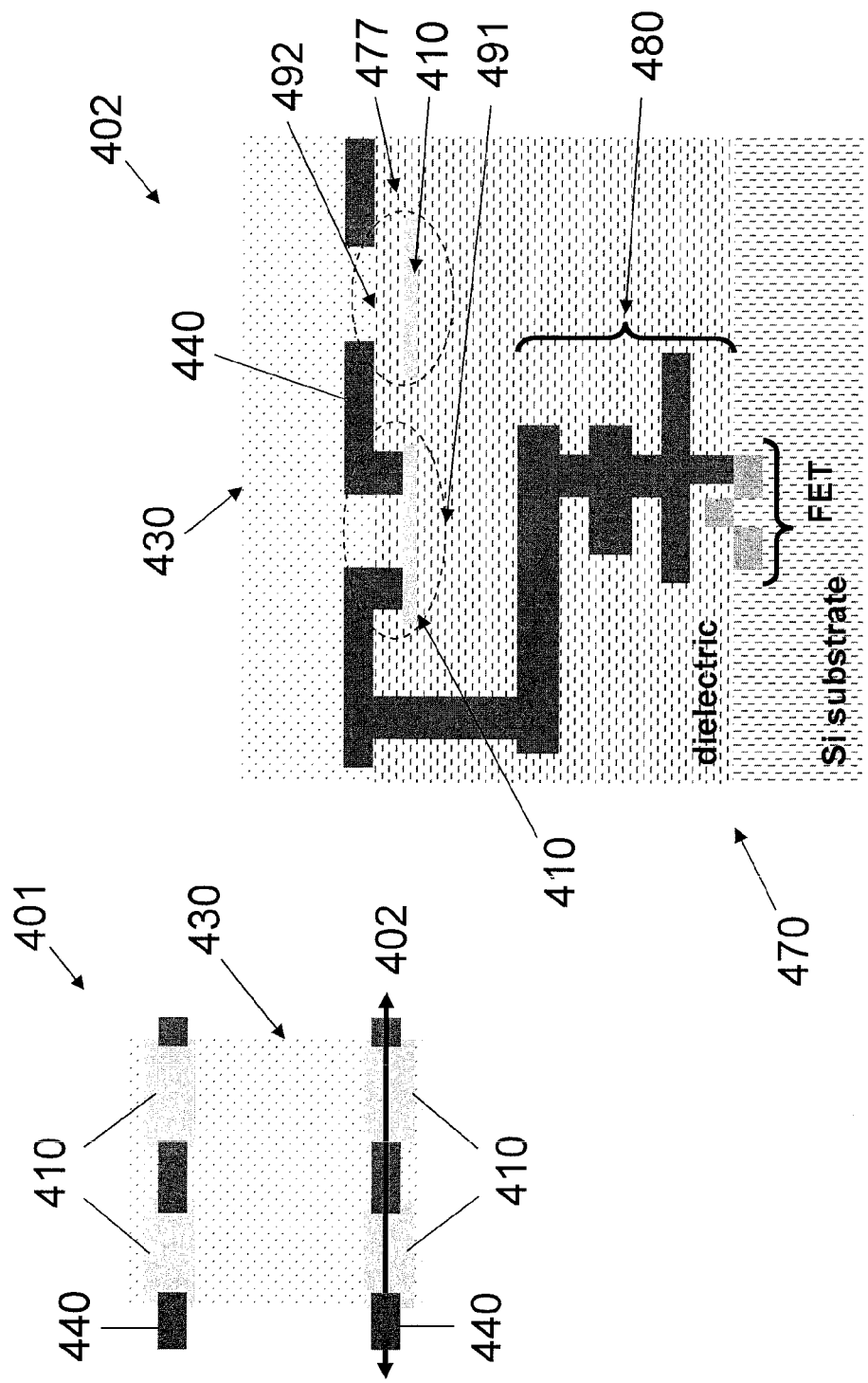
FIG. 4 shows a top view 401 and a cross-section 402 of a chip having a graphene resistor series configured array 410 forming an on-chip identifier with off-chip reading, in accordance with an embodiment of the present principles.
Figure 5:
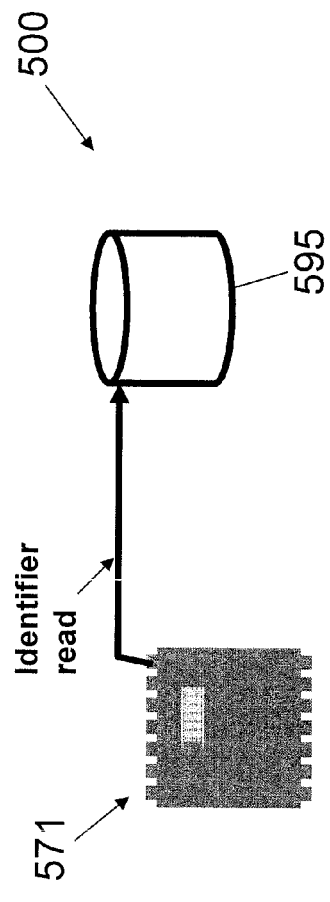
FIG. 5 shows an exemplary configuration 500 for a manufacturing test, in accordance with an embodiment of the present principles.

FIG. 4 shows a top view 401 and a cross-section 402 of a chip having a graphene resistor series configured array 410 forming an on-chip identifier with off-chip reading, in accordance with an embodiment of the present principles. On the left, the top view 401 shows where the cross section 401 is taken. On the right, the cross section 402 shows an example of integration of a graphene resistor 410 into a VLSI chip 470. In that case, the graphene resistor 410 is integrated at the end of the VLSI process, and is connected from the top to the last layer of metal 440. The last layer of metal 440 is connected to the VLSI wiring with vias 480. The graphene resistor can be connected to the last layer of metal with vias (DC coupling 491) or without vias through a Metal Insulator Graphene (MIG) capacitor 477 (AC coupling 492). The temperature profile of the resistor can be read by a thermal camera or regular camera if a thermochromic film 430 is used.

FIG. 7 shows an exemplary configuration 500 for a manufacturing test, in accordance with an embodiment of the present principles. The configuration 500 involves a chip embedded with a graphene identifier (collectively denoted by the reference number 571) and an identification database 595. During the manufacturing test, the chip identification code is read and stored in the identification database 595.

Figure 6:
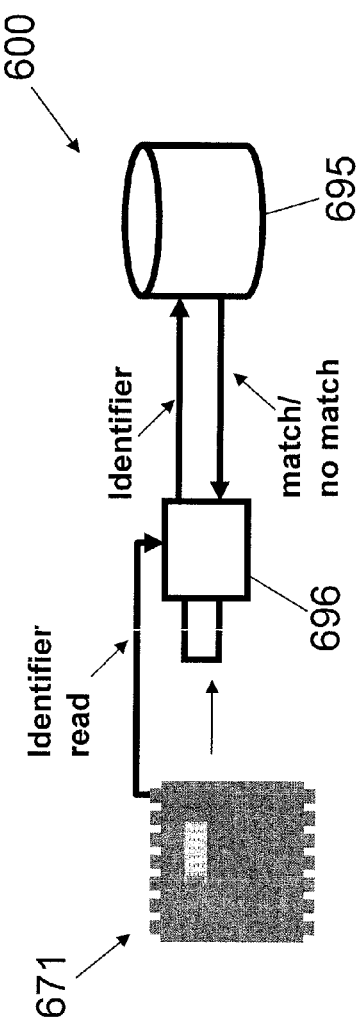
FIG. 6 shows an exemplary configuration 600 for chip identification in the field, in accordance with an embodiment of the present principles.

FIG. 6 shows an exemplary configuration 600 for chip identification in the field, in accordance with an embodiment of the present principles. The configuration 600 involves a chip embedded with a graphene identifier (collectively denoted by the reference number 671), an optical or electrical reader with a ramped power supply 696, and an identification database 695. In the field, the chip identification code is read electrically or optically through the chip package transparent window using the optical or electrical reader 696. The chip identification code is sent to the identification database 695 which confirms if the chip is legitimate, e.g., by providing a match or no-match indication.

FIG. 7 shows an exemplary graphene resistor parallel configured array 710 that is applied to an object that needs an identifier, in accordance with an embodiment of the present principles. Thus, in this embodiment, the graphene resistor array is not embedded into a chip but is applied to an object that needs an identifier. The array 710 includes resistors R1 through R6. The resistors in the graphene resistor array 710 are connected in parallel and generate random resistance-values with large variability during fabrication. The random resistance values allow us to generate a unique identification code, thus implementing a physical unclonable function (PUF). Since graphene has no bandgap, graphene resistor values do not change with temperature. This provides a guaranty of identifier stability across temperature. The graphene resistor array is put into contact with a DC power supply 720. Metal connections 740 connect the array 710 to the DC power supply 720. Each graphene resistor dissipates power ($V^2/Rn$), and therefore will have different temperature. The temperature profile can be read by a thermal camera. A thermochromic film 730 can be used to transform the thermal information into color, thus allowing the use of a regular camera. The DC supply 720 can be ramped up and down alternatively to generate a variable image of the identifier. Instead of the code information being encoded for a fixed voltage supply, the code information can be encoded in the color variation of the identifier as the temperature changes in the graphene resistors. This approach allows us to eliminate the effect of ambient temperature on the thermochromic film 730.

The thin film graphene resistor array 710 can be attached to an object that needs identification, and any attempt to remove a graphene sheet would destroy it physically or change the identification code. Indeed any exposure to air would change the graphene resistor values. This makes the graphene resistor tamperproof.

FIG. 8 shows an exemplary graphene resistor series configured array 810 that is applied to an object that needs an identifier, in accordance with an embodiment of the present principles. The array 810 includes resistors R1 through R6. The embodiment involves a DC power supply 820 connected to the array 810 using metal connections 840. A thermochromic film 830 can be used to allow the temperature profile of the resistors to be read by a thermal camera or regular camera. Thus, in the embodiment, the graphene resistor array 810 is connected in series and the properties and functions are similar to those described with respect to FIG. 7.

Figure 9:
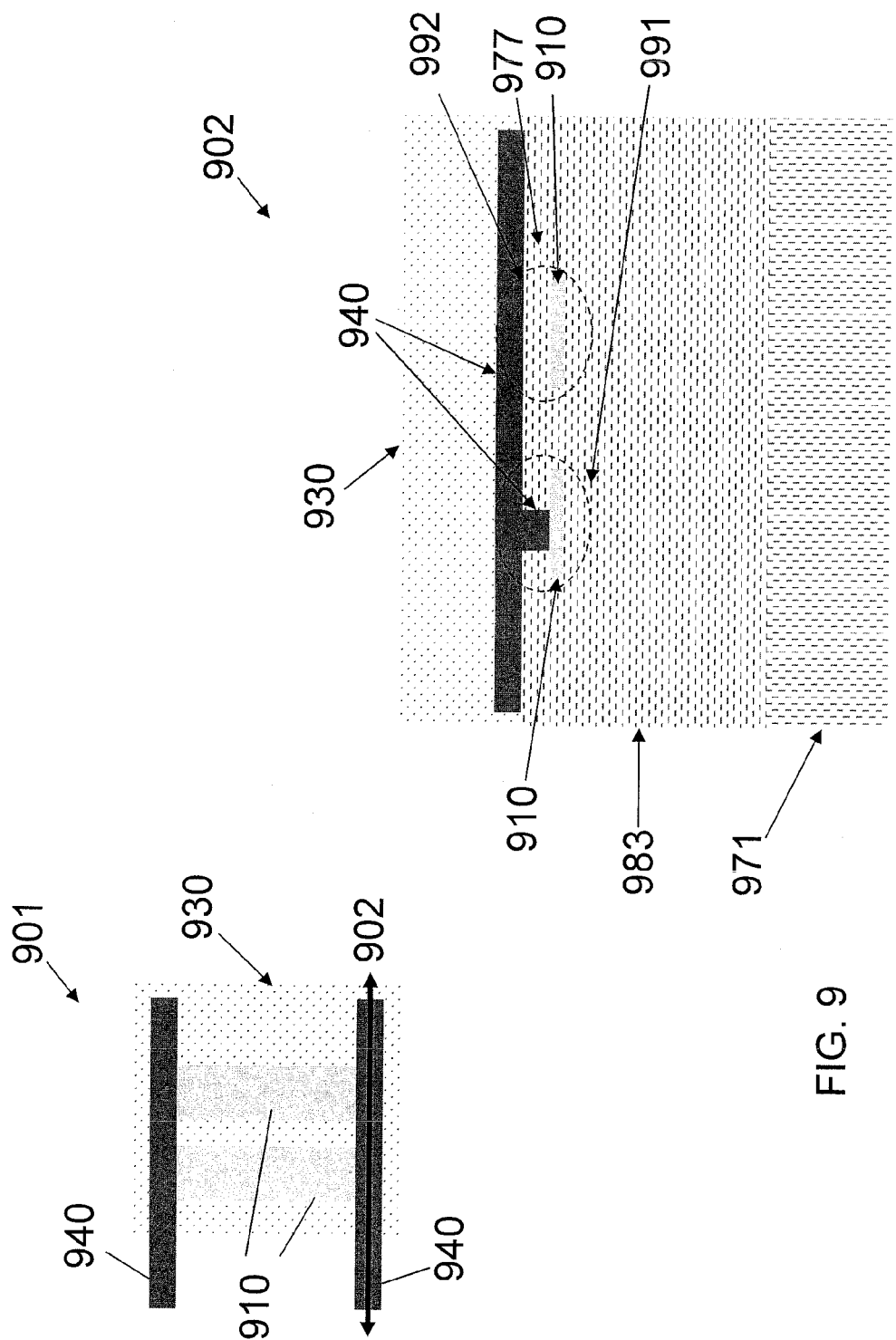
FIG. 9 shows a top view 901 and a cross-section 902 of a chip having a graphene resistor parallel configured array 910 forming an on-chip identifier with off-chip reading, in accordance with an embodiment of the present principles.

Example implementations of the inventions of FIGS. 7 and 8 are shown and described with respect to FIGS. 9 and 10. Of course, the inventions of FIGS. 7 and 8 are not limited to the example implementations of FIGS. 9 and 10 and, thus, other implementations can also be readily determined by one of ordinary skill in the art given the teachings of the present principles provided herein, while maintaining the spirit of the present principles.

FIG. 9 shows a top view 901 and a cross-section 902 of a chip having a graphene resistor parallel configured array 910 forming an on-chip identifier with off-chip reading, in accordance with an embodiment of the present principles. The structure includes identically patterned graphene resistors 910 on a substrate 971 covered with a layer of oxide 972 and a thermochromic film 930 is made to blanket the graphene, providing the visible change in color of the different resistors during operation. In one embodiment, the substrate 971 can be a ridged material, such a silicon. In the case of silicon, a layer of SiO2 can be formed using a standard thermal oxidation process. In another embodiment, the substrate 971 is comprised of a flexible material, including but not limited to polyimide or PET, with an oxide deposited on top using a chemical vapor deposition (CVD) or atomic layer deposition (ALD) process, for example. Graphene can be transferred to this structure using one of several methods well known in art and patterned into resistors of identical size with lithography and $O_2$ etch measures. After establishing contacts to the graphene, a thermochromic film 930, such as chiral nematic sprayable liquid crystal, can be deposited (by spin coating in this case). The graphene resistor 910 can be contacted with a metal 940 to allow DC flowing current (DC coupling 991). Another option is to have a thin dielectric 983 in between the connection metal and the graphene resistor to allow only AC current to flow (AC coupling 992) so as to form a metal insulator graphene (MIG) capacitor 977. The metal insulator graphene (MIG) capacitor allows the AC current to flow to each resistor and the insulator is used to thermally isolate each graphene resistor. CVD or ALD processing can again be used to deposit a suitable dielectric and a seed layer may be used to promote adhesion of the oxide (not pictured) including, but not limited to, for example, TiOx, AlOxNy, and so forth.

FIG. 10 shows an exemplary configuration 1000 for a manufacturing test, in accordance with an embodiment of the present principles. The configuration 1000 involves a plastic card 1053 (e.g., a credit card, debit card, rewards card, gift card, and so forth) embedded with a graphene resistor array 1010, a ramp power supply 1047, an identifier reader 1096, and an identification database 1095. The code is read through a transparent window 1051 during the manufacturing test, and stored in the identification database.

Thus, it is to be appreciated that an identifier in accordance with the present principles can be made flexible and thin so as to be incorporated into a bill, medication, and essentially almost any item. In some embodiments, the identifier is attached to an item requiring identification. Such attachment can be implemented using a manner such that subsequent tampering with the identifier renders the code associated therewith indeterminable. In other embodiments, the identifier can be integrated with the item. For example, in an embodiment, the identifier can be embedded in a chip, a wafer, and so forth. These and other applications of the present principles are readily determined by one of ordinary skill in the art given the teachings of the present principles provided herein, while maintaining the spirit of the present principles.

FIG. 11 shows an exemplary configuration 1100 for identification in the field, in accordance with an embodiment of the present principles. The configuration 1100 involves a plastic card 1153 (e.g., a credit card, debit card, rewards card, gift card, and so forth) embedded with a graphene resistor array 1110, an optical reader with ramp supply 1196, and an identification database 1195. In the field, the reader 1196 contacts the identifier, ramps the power, and reads the code. In an embodiment, the reader 1196 is and/or otherwise includes a thermal imager and/or a camera. The read code is then compared with the code stored in the identification database 1195. In an embodiment, the identification database 1195 is a secure database.

Figure 12:
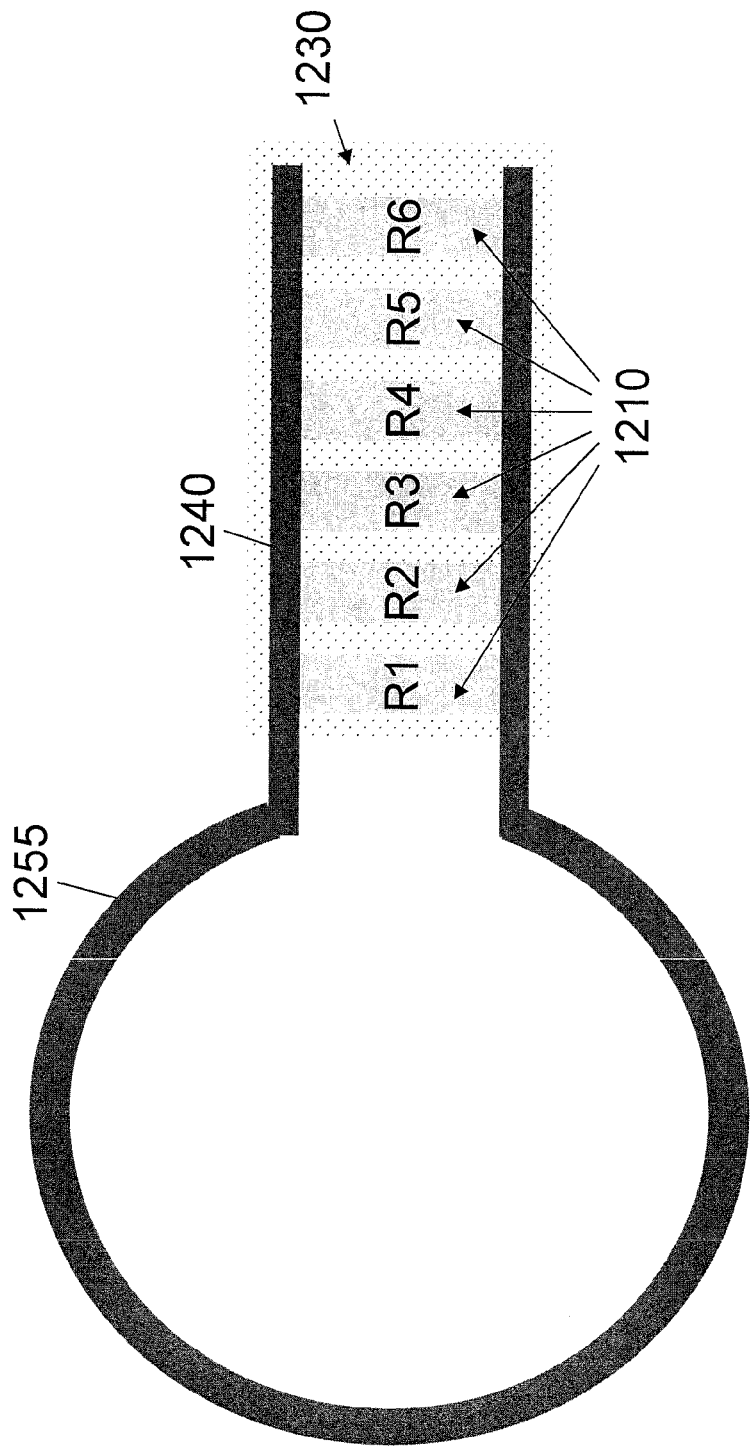
FIG. 12 shows an exemplary graphene resistor parallel configured array configuration 1200, in accordance with an embodiment of the present principles.

FIG. 12 shows an exemplary graphene resistor parallel configured array configuration 1200, in accordance with an embodiment of the present principles. A graphene resistor array 1210 includes resistors R1 through R6 configured in parallel. The graphene resistor array 1210 is connected to a coil 1255 that is used as an energy coupling device. The coil 1255 can be fabricated for example with the same metal 1240 that is used to connect the resistor array or from some other metal layers. The configuration 1400 includes a thermochromic film 1230.

Figure 13:
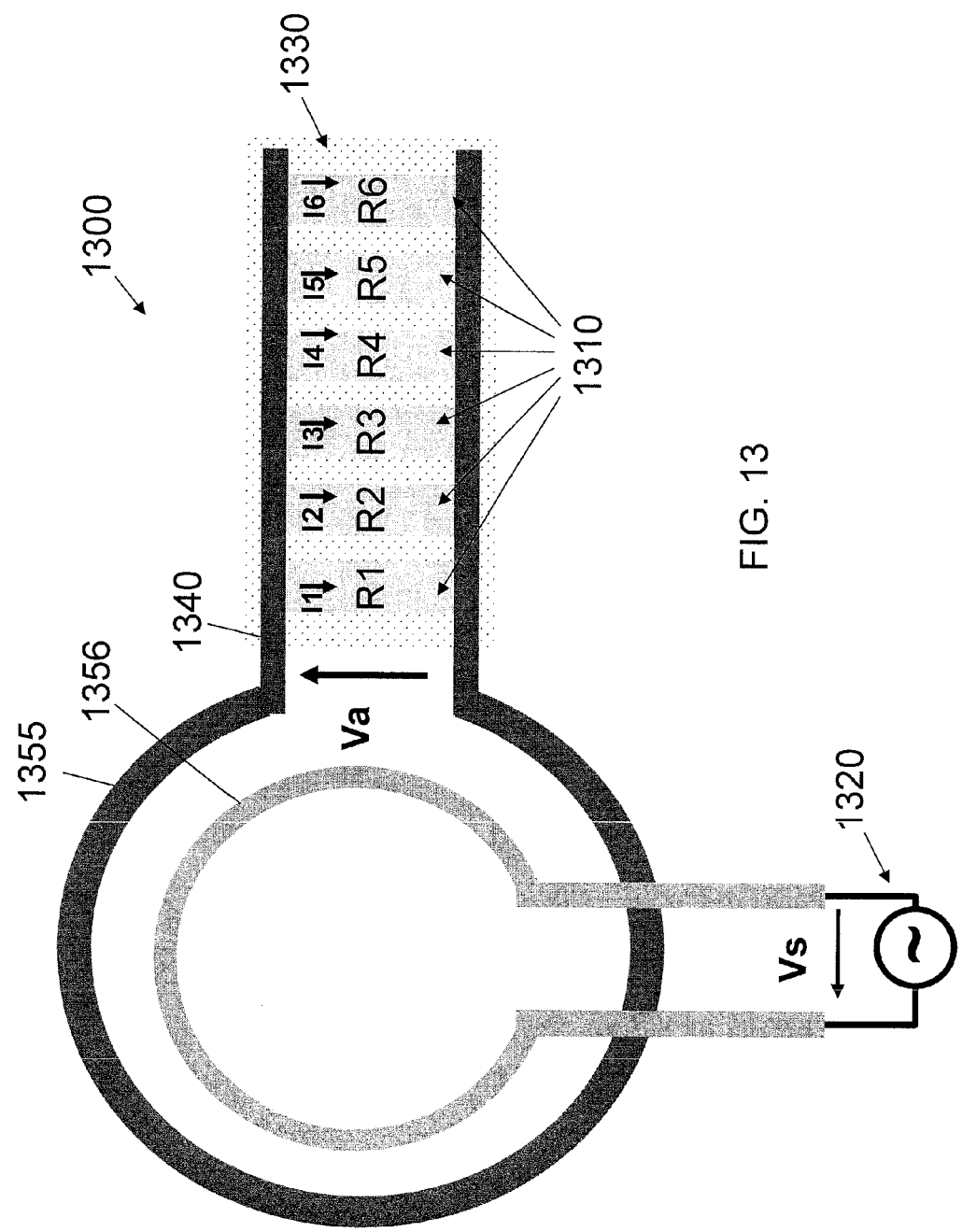
FIG. 13 shows another exemplary graphene resistor parallel configured array configuration 1300, in accordance with an embodiment of the present principles.

FIG. 13 shows another exemplary graphene resistor parallel configured array configuration 1300, in accordance with an embodiment of the present principles. A graphene resistor array 1310 includes resistors R1 through R6 configured in parallel. A second coil 1356 that is not in contact with the first coil 1355 allows for transferring power from an external source 1320 to the graphene resistor array 1310. Thus, the configuration 1300 allows wireless reading. An AC power source 1320, such as, for example, a sinusoidal generator, can be used. The AC power source 1320 generates a sinusoidal signal with an amplitude Vs. The AC signal amplitude is Va=k Vs, where k is the coupling coefficient between the two coils 1355 and 1356. The power dissipated in each graphene resistor is $P_{Rx}=0.5\ Va^2/Rx$. As described in the previous embodiments, either a thermal imager camera is used or a thermochromic film 1330 is placed on top of the graphene resistors allowing reading the temperature of each resistor with a regular camera. The coil 1355 can be fabricated for example with the same metal 1340 that is used to connect the resistor array or from some other metal layers.

Figure 14:
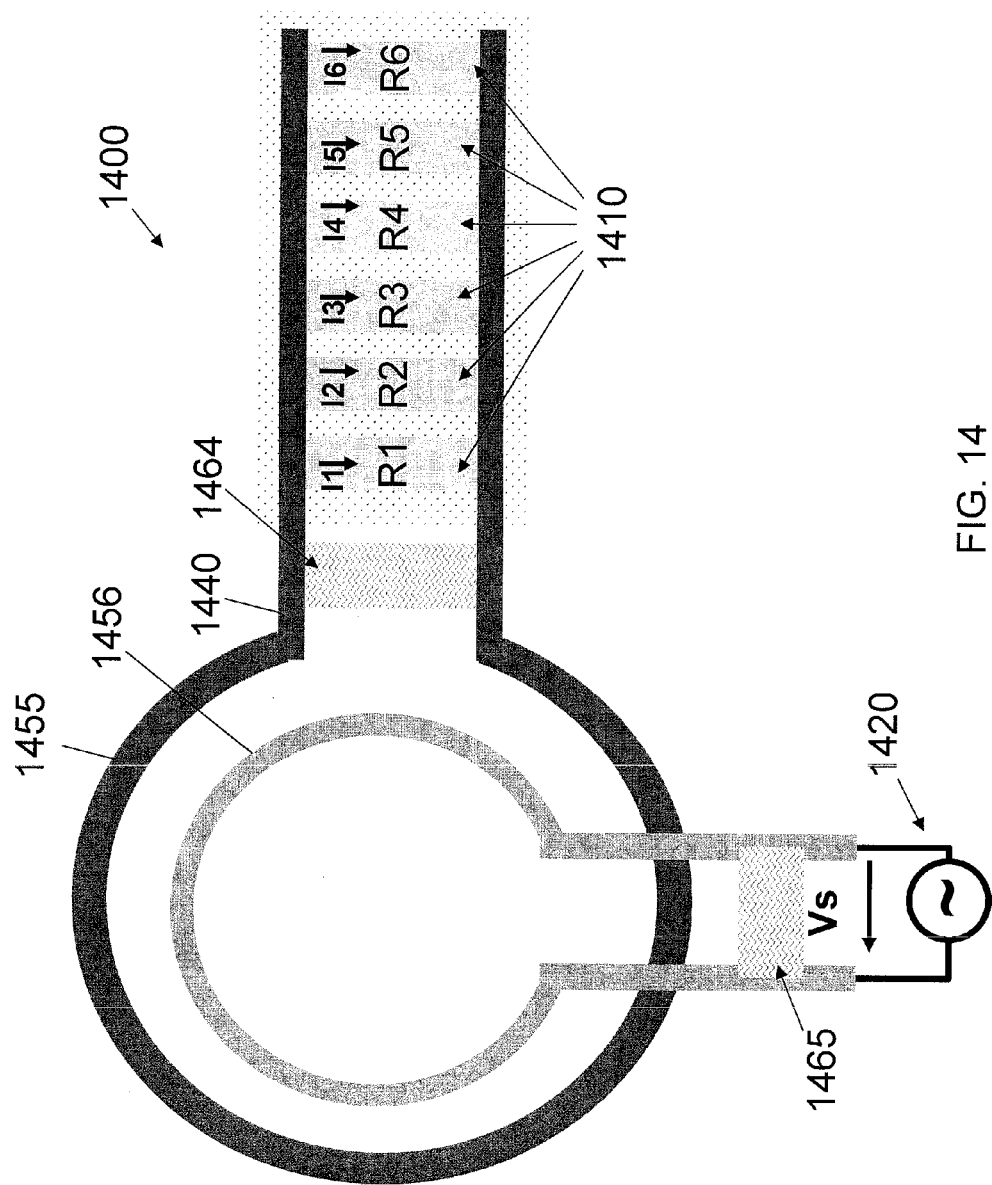
FIG. 14 shows yet another exemplary graphene resistor parallel configured array configuration 1400, in accordance with an embodiment of the present principles.

FIG. 14 shows yet another exemplary graphene resistor parallel configured array configuration 1400, in accordance with an embodiment of the present principles. A graphene resistor array 1410 includes resistors R1 through R6 configured in parallel. A second coil 1456 that is not in contact with the first coil 1455 allows for transferring power from an external source 1420 to the graphene resistor array 1410.

Thus, the configuration 1400 allows wireless reading. An AC power source 1420, such as, for example, a sinusoidal generator, can be used. In an embodiment, the second coil 1456 can be placed at a different height than the first coil 1455. Capacitor C1 1464 and capacitor C2 1465 are used to resonate the first and second coils, allowing a better energy coupling and therefore the reader can be placed at a higher distance from the graphene array coil. The configuration 1400 includes a thermochromic film 1430. The code reading can be done the same way as in the previous embodiment. The coil 1455 can be fabricated for example with the same metal 1440 that is used to connect the resistor array or from some other metal layers.

Figure 15:
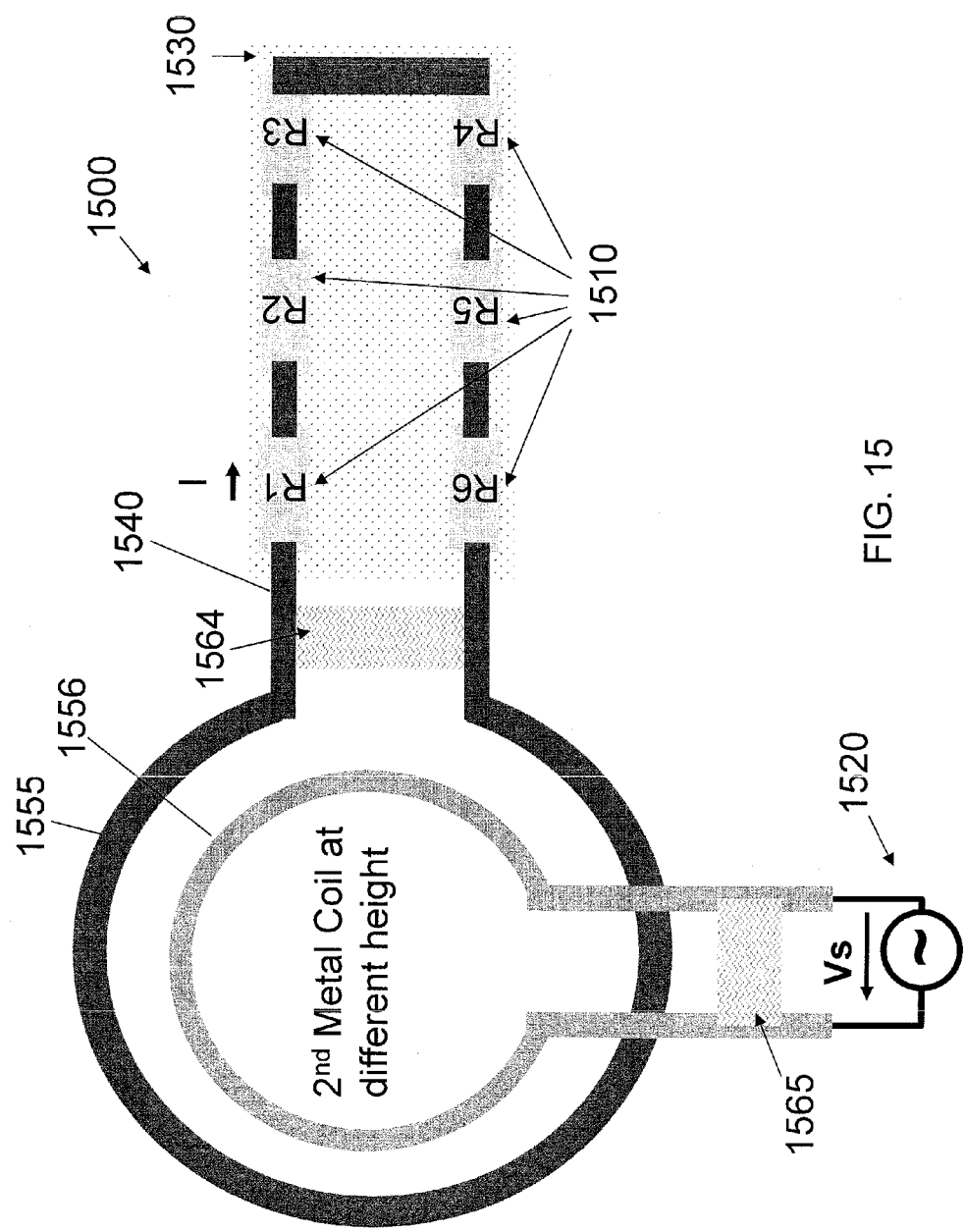
FIG. 15 shows yet another exemplary graphene resistor series configured array configuration 1500, in accordance with an embodiment of the present principles.

FIG. 15 shows yet another exemplary graphene resistor series configured array configuration 1500, in accordance with an embodiment of the present principles. A graphene resistor array 1510 includes resistors R1 through R6 configured in series. A second coil 1556 that is not in contact with the first coil 1555 allows for transferring power from an external source 1520 to the graphene resistor array 1510. Thus, the configuration 1500 allows wireless reading. An AC power source 1520, such as, for example, a sinusoidal generator, can be used. In an embodiment, the second coil 1556 can be placed at a different height than the first coil 1555. Capacitor C1 1564 and capacitor C2 1565 are used to resonate the first and second coils, allowing a better energy coupling and therefore the reader can be placed at a higher distance from the graphene array coil. The configuration 1500 includes a thermochromic film 1530. For a sinusoidal AC source, the power dissipated by each resistor is $0.5 \, R \times I^2$. The code reading is done the same way as in the previous embodiments. The coil 1555 can be fabricated for example with the same metal 1540 that is used to connect the resistor array or from some other metal layers.

Figure 16:
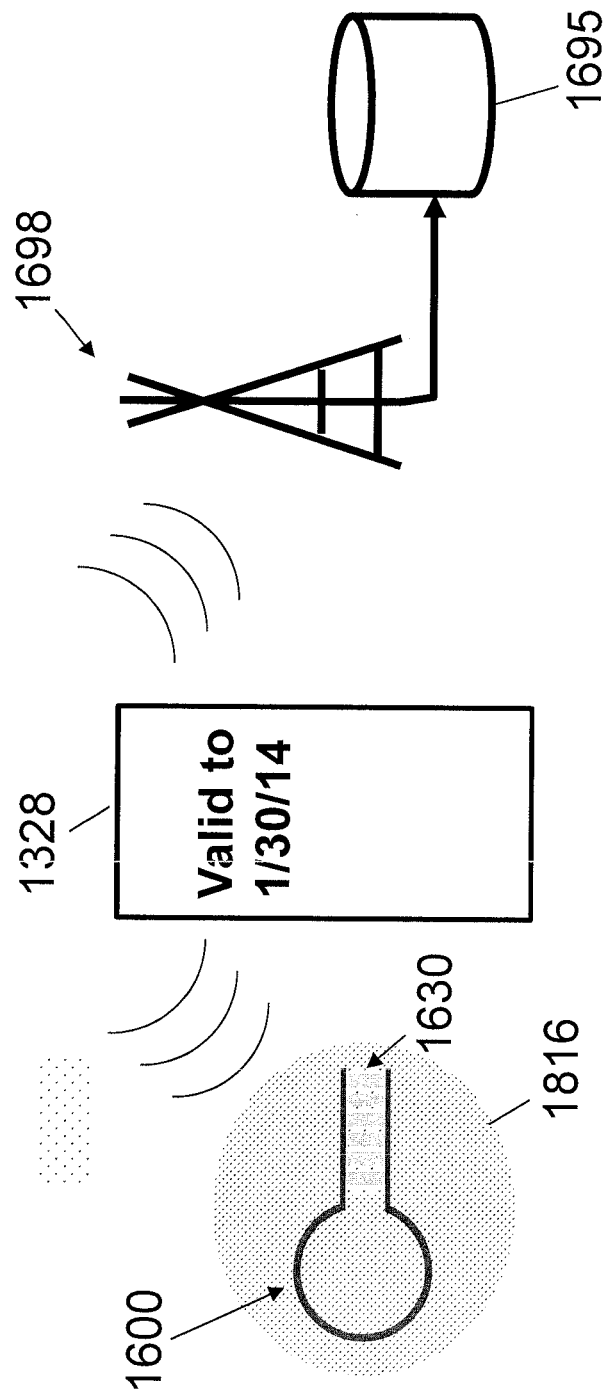
FIG. 16 shows a medication identification application using a graphene resistor identifier 1600, in accordance with an embodiment of the present principles.

FIG. 16 shows a medication identification application using a graphene resistor identifier 1600, in accordance with an embodiment of the present principles. A graphene resistor identifier 1600 is, for example, embedded inside a bottle cap 1616 of a medicine container. A smartphone 1628 sends an RF signal and powers up a graphene bar code corresponding to the graphene resistor identifier 1600. A picture of the bar code is taken with the smartphone camera 1628. The smartphone 1628 interrogates an identification database 1695 for authentication through a cell phone or WIFI network 1698. The code space can be greatly expanded by allowing its potential reuse across product categories. In that case, the product category can be entered manually or can be read directly with the smartphone camera from the packaging bar code. Another layer of tampering protection can be added by using a graphene protective layer 1631 that decomposes when exposed to air. While opening the product, the protective layer 1631 could be removed starting the count down for the graphene identifier 1600. The graphene protective layer 1631 would start to decompose, and the graphene identifier 1600 would stop working after a target expiration time.

Figure 17:
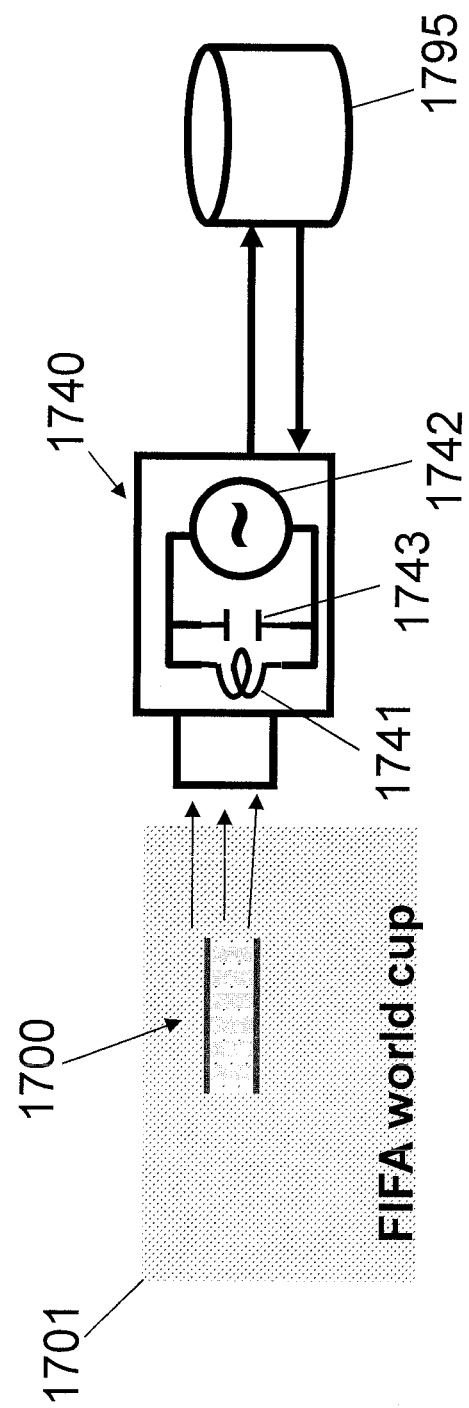
FIG. 17 shows a ticket or bill identification application using a graphene resistor identifier 1700, in accordance with an embodiment of the present principles.

FIG. 17 shows a ticket or bill identification application using a graphene resistor identifier 1700, in accordance with an embodiment of the present principles. The graphene resistor identifier 1700 is, for example, embedded inside the ticket or bill paper 1701. The code can be read through a transparent window. A reader 1740 includes a coil 1741, an RF generator 1742, and a CMOS imager 1743. The reader 1740 interrogates an identification database 1795 to authenticate the ticket.

Figure 18:
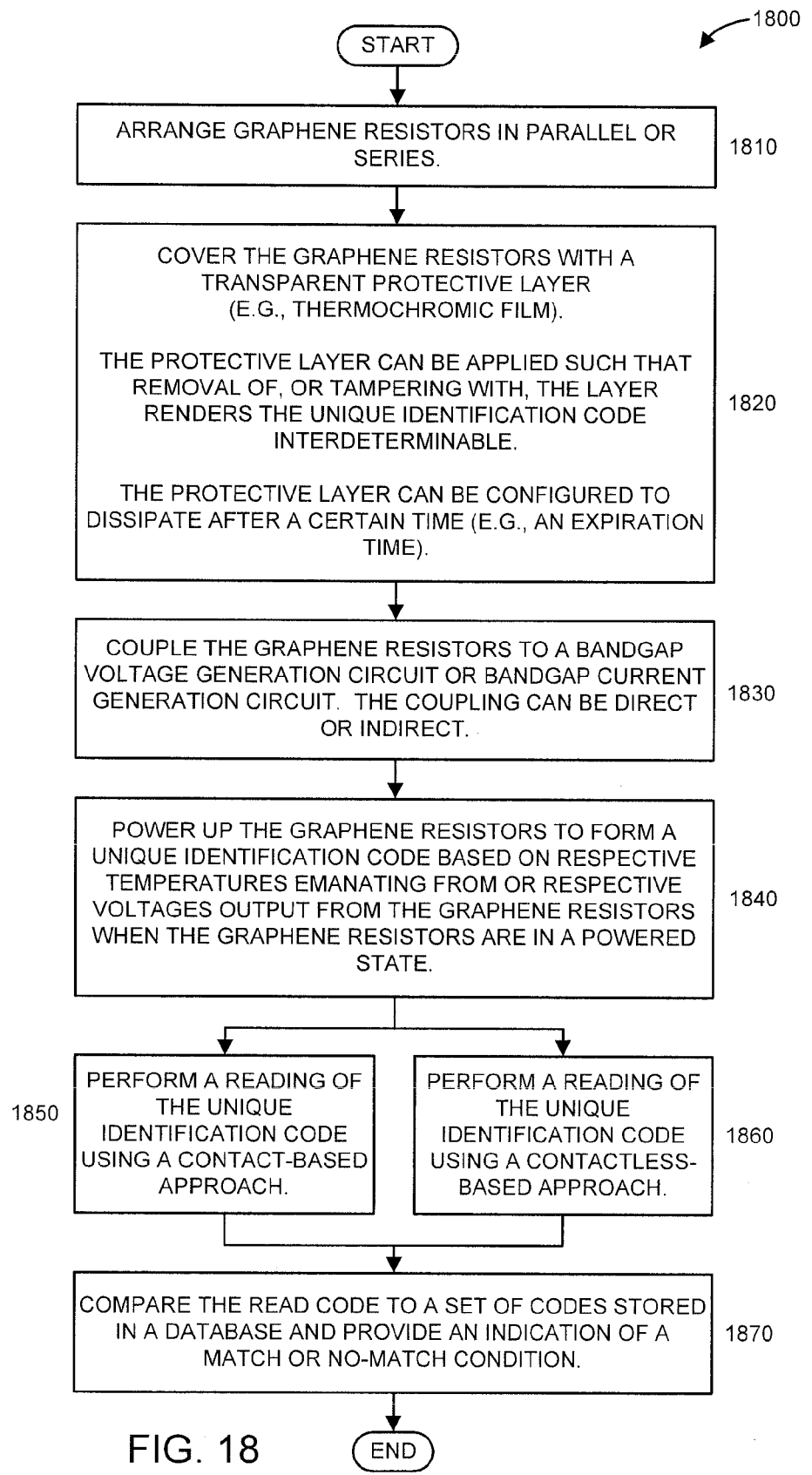
FIG. 18 shows a method 1800 for forming a unique identifier code using a plurality of graphene resistors, in accordance with an embodiment of the present principles.

FIG. 18 shows a method 1800 for forming a unique identifier code using a plurality of graphene resistors, in accordance with an embodiment of the present principles. At step 1810, arrange graphene resistors in parallel or series.

At step 1820, cover the graphene resistors with a transparent protective layer. The transparent protective layer can include, for example, a thermochromic film for transforming thermal information corresponding to the respective temperatures into colors ascertainable by a camera. The transparent protective layer can be applied to the graphene resistors such that removal of, or tampering with, the transparent protective layer renders the unique identification code indeterminable. The transparent protective layer can be selected and/or configured to dissipate after a certain amount of time. The certain amount of time can be an expiration time for the unique identification code.

At step 1830, couple the graphene resistors to a bandgap voltage generation circuit or a bandgap current generation circuit. The coupling can be direct or indirect.

At step 1840, power up the graphene resistors to form a unique identification code based on respective temperatures emanating from or respective voltages output from the graphene resistors when the graphene resistors are in a powered state. The unique identification code can be encoded using and thus, determinable from, for example, respective color values of the graphene resistors, respective differences between color values of the graphene resistors, and/or respective source power levels at which respective color changes occur in the graphene resistors.

Regarding step 1850 and 1860, either (or both) can be performed, depending upon the implementation.

At step 1850, perform a reading of the unique identification code using a contact-based approach. For example, the power output of the voltage or current generation circuit can be swept with a ramp signal to reveal a unique time-varying image that is read as the unique identification code. In an embodiment, step 1850 can include multiplexing voltages output from the graphene resistors when the graphene resistors are in the powered state to provide a single output voltage, and converting the single output voltage to a digital value readable as the unique identification code.

At step 1860, performing a reading of the unique identification code using a contactless-based approach. For example, the power output of the voltage or current generation circuit can be swept with a ramp signal to reveal a unique time-varying image that is read as the unique identification code. In an embodiment, step 1860 can include coupling a (first) coil to the graphene resistors for alternating current inductive reading of the unique identification code. Moreover, step 1860 can further include placing another (second) coil proximate to and at a different height than the (first) coil. The other (second) coil can be indirectly (inductively) coupled to the bandgap voltage generation circuit to inductively power up the graphene resistors to read the unique identification code there from.

At step 1870, compare the read unique identification code to a set of unique identification codes stored in a secure authentication database and provide an indication of a match condition or a no-match condition.

A description will now be given of a particular passivated Graphene resistor device, in accordance with an embodiment of the present principles. In the embodiment, the channel dimensions are as follows:

$L_{ch} = 300$ nm $W_{ch} = 2.1$ μm

The Cu contacts are annealed in high vacuum for 15-hour at 350° C. The blanket passivation layer has the following characteristics:

0.9 nm thermally evaporated Ti seed layer 15 nm ALD $Al_2O_3$

The passivation layer is expected to reduce/eliminate the impact of physisorbed molecules to improve stability. Regarding the temperature dependence of passivated Graphene resistor devices, $R_C$ increases systematically with increasing temperature—some temperature dependence.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method, comprising:
   arranging a plurality of graphene resistors in parallel or series; and
   forming a unique identification code based on respective temperatures emanating from or respective voltages output from the plurality of graphene resistors when the plurality of graphene resistors are in a powered state.

2. The method of claim 1, further comprising contactlessly reading the unique identification code from the respective temperatures.

3. The method of claim 1, further comprising covering the plurality of graphene resistors with a transparent protective layer.

4. The method of claim 3, wherein the transparent protective layer is applied to the plurality of graphene resistors such that removal of, or tampering with, the transparent protective layer renders the unique identification code indeterminable.

5. The method of claim 3, wherein the transparent protective layer dissipates after a certain amount of time, the certain amount of time being an expiration time for the unique identification code.

6. The method of claim 1, further comprising coating the plurality of graphene resistors with a thermochromic film for transforming thermal information corresponding to the respective temperatures into colors ascertainable by a camera.

7. The method of claim 1, wherein said forming step comprises coupling the plurality of graphene resistors to a bandgap voltage generation circuit or a bandgap current generation circuit.

8. The method of claim 7, further comprising embedding the plurality of graphene resistors and the bandgap voltage generation circuit or the bandgap current generation circuit into a chip.

9. The method of claim 7, wherein the method further comprises:
   multiplexing a plurality of voltages output from the plurality of graphene resistors when the plurality of graphene resistors are in the powered state to provide a single output voltage; and
   converting the single output voltage to a digital value readable as the unique identification code.

10. The method of claim 1, wherein each of the plurality of graphene resistors has a temperature independent resistor value and the method further comprises configuring the plurality of graphene resistors as a physical unclonable function.

11. The method of claim 1, wherein the unique identification code is encoded using respective color values of the plurality of graphene resistors.

12. The method of claim 1, wherein the unique identification code is encoded using respective differences between color values of the plurality of graphene resistors.

13. The method of claim 1, wherein the unique identification code is encoded using respective source power levels at which respective color changes occur in the plurality of graphene resistors.

14. The method of claim 1, further comprising coupling a coil to the plurality of graphene resistors for alternating current inductive reading of the unique identification code.

15. The method of claim 14, further comprising placing another coil proximate to and at a different height than the coil, the other coil connected to a bandgap voltage generation circuit to inductively power up the plurality of graphene resistors to read the unique identification code there from.

16. The method of claim 1, further comprising:
   sweeping an output of the bandgap voltage generation circuit or a bandgap current generation circuit with a ramp signal to reveal a time varying image; and
   comparing the time varying image, as the unique identification code, to a plurality of images stored in an authentication database to authenticate the unique identification code.

17. An authentication apparatus, comprising:
   a plurality of graphene resistors, arranged in parallel or series, forming a unique identification code based on respective temperatures emanating from or respective voltages output from the plurality of graphene resistors when the plurality of graphene resistors are in a powered state; and
   a bandgap voltage generation circuit or a bandgap current generation circuit connected to the plurality of graphene resistors for powering up the plurality of graphene resistors in the powered state.

18. The authentication apparatus of claim 17, wherein the plurality of graphene resistors and the bandgap voltage generation circuit or the bandgap current generation circuit are embedded into a chip.

19. The authentication apparatus of claim 17, further comprising a transparent protective layer for covering the plurality of graphene resistors.

20. The authentication apparatus of claim 17, further comprising:
   a multiplexer for multiplexing together the respective output voltages to provide a single output voltage;
   an analog-to-digital converter for converting the single output voltage to a digital value that is contactlessly readable as the unique identification code.

* * * * *